(12) United States Patent
Mori et al.

(10) Patent No.: US 6,404,023 B1
(45) Date of Patent: Jun. 11, 2002

(54) SEMICONDUCTOR DEVICE HAVING GATE-GATE, DRAIN-DRAIN, AND DRAIN-GATE CONNECTING LAYERS AND METHOD OF FABRICATING THE SAME

(75) Inventors: Katsumi Mori; Kei Kawahara; Yoshikazu Kasuya, all of Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/758,388

(22) Filed: Jan. 12, 2001

(30) Foreign Application Priority Data

Jan. 14, 2000 (JP) ........................................ 2000-006678

(51) Int. Cl.[7] .............................................. H01L 29/76
(52) U.S. Cl. ........................ 257/393; 257/393; 257/903; 257/327; 257/401; 438/152
(58) Field of Search ................................ 257/393, 401, 257/903, 327, 369, 383; 438/152; 365/182

(56) References Cited

U.S. PATENT DOCUMENTS

| | | | | |
|---|---|---|---|---|
| 5,394,358 A | * | 2/1995 | Huang | 365/182 |
| 5,521,860 A | * | 5/1996 | Ohkubo | 365/154 |
| 5,754,468 A | * | 5/1998 | Hobson | 365/156 |
| 5,930,163 A | | 7/1999 | Hara et al. | 365/154 |
| 6,147,385 A | * | 11/2000 | Kim et al. | 257/369 |

FOREIGN PATENT DOCUMENTS

| | | |
|---|---|---|
| JP | A 10-41409 | 2/1998 |
| JP | A 10-178110 | 6/1998 |

OTHER PUBLICATIONS

U.S. application No. 09/736,386, T. Kumagai, filed Dec. 15, 2000.
M. Ishida, et al. "International Electron Devices Meeting" (IEDM) Technical Digest, (4 N. 1998), p 203.

* cited by examiner

Primary Examiner—David Nelms
Assistant Examiner—Tu-Tu Ho
(74) Attorney, Agent, or Firm—Oliff & Berridge, PLC (57) ABSTRACT

A semiconductor device comprising a peripheral circuit portion and a memory cell portion including a plurality of memory cells. Each memory cell has first and second gate-gate connecting layers, first and second drain-drain connecting layers, and first and second drain-gate connecting layers. The first and second gate-gate connecting layers respectively connect the gates of driver transistors to the gates of load transistors. The first and second drain-drain connecting layers are formed over a first interlayer dielectric and respectively connect the drains of driver transistors to the drains of load transistors. The first and second drain-gate connecting layers are formed over a second interlayer dielectric and respectively connect the first drain-drain connecting layer to the second gate-gate connecting layer and the second drain-drain connecting layer to the first gate-gate connecting layer.

24 Claims, 10 Drawing Sheets

SEMICONDUCTOR DEVICE HAVING GATE-GATE, DRAIN-DRAIN, AND DRAIN-GATE CONNECTING LAYERS AND METHOD OF FABRICATING THE SAME

BACKGROUND OF THE INVENTION

1. Field of the Invention

The present invention relates to a semiconductor device and a method of fabricating the same. More particularly, the present invention relates to a semiconductor device including a static random access memory (SRAM) and a method of fabricating the same.

2. Description of Related Art

An SRAM is one type of semiconductor memory device and does not need refreshing. Therefore, the SRAM enables system configuration to be simplified and consumes only a small amount of current in await mode. Because of this, the SRAM is suitably used as a memory for portable devices such as a portable telephone in which the number of parts is limited and the power consumption therefor is required to be small.

The SRAM generally stores information using a flip-flop formed of two inverters, each having a load transistor and a driver transistor. The flip-flop is formed by connecting the gate electrode of one inverter to the drain of the other inverter. Specifically, the flip-flop is formed by cross-coupling one inverter with the other.

At present, miniaturization of portable devices is strongly demanded. As a means to achieve such a demand, miniaturization of memory cells of the SRAM has been demanded. For example, miniaturization of an SRAM by forming a flip-flop using two layers has been attempted.

In the case of forming a flip-flop using two layers, a layer for connecting the drains of each inverters and a layer for connecting the drain and the gate of the inverter can be cross-coupled by forming these layers as one conductive layer. According to this structure, such a conductive layer is formed over the regions including a region in which the drain of one inverter is formed, a region in which the gate of the other inverter is formed, and a region which connects these regions. Therefore, the conductive layer has a pattern with three ends (for example, a pattern having a branched portion in the shape of the letters "T" or "h"), or a spiral pattern in which the arms are intricate. For example, a pattern having a branched portion in the shape of the letter "T" is disclosed by Japanese Patent Application Laid-open No. 10-41409 in FIG. 1. A pattern with a branched portion in the shape of the letter "T" is also disclosed by M. Ishida, et. al. in *International Electron Devices Meeting Technical Digest*, 1998, page 203, FIG. 4(b). An example of a spiral pattern also can be seen in this *International Electron Devices Meeting Technical Digest*, page 203, FIG. 3(b).

However, in the case of SRAMs having such patterns, since the flip-flop is formed using two layers, the patterns of each layer are complicated. Therefore, it is difficult to reproduce the shape of a minute pattern in a photoetching step with high accuracy, whereby a desired pattern cannot be obtained. This hinders miniaturization of the memory size.

SUMMARY OF THE INVENTION

An objective of the present invention is to provide a semiconductor device having memory cells with a reduced size.

Another objective of the present invention is to provide a method of fabricating a more miniaturized semiconductor device.

According to a first aspect of the present invention, there is provided a semiconductor device comprising:
a memory cell portion having memory cells each of which includes two load transistors, two driver transistors, and two access transistors; and
a peripheral circuit portion which includes MOS transistors, wherein:
each of the memory cells includes first and second gate-gate connecting layers, first and second drain-drain connecting layers, and first and second drain-gate connecting layers;
the first and second gate-gate connecting layers are formed over a semiconductor substrate;
the first and second drain-drain connecting layers are formed over a first interlayer dielectric and connect drains of the load transistors with drains of the driver transistors;
the first and second drain-gate connecting layers are formed over a second interlayer dielectric;
the first drain-gate connecting layer connects the first drain-drain connecting layer to the second gate-gate connecting layer;
the second drain-gate connecting layer connects the second drain-drain connecting layer to the first gate-gate connecting layer;
the first and second gate-gate connecting layers, the first and second drain-drain connecting layers, and the first and second drain-gate connecting layers are provided in different layers at different levels;
the peripheral circuit portion has the first interlayer dielectric, the second interlayer dielectric, and a first wiring layer formed over the second interlayer dielectric; and
the first and second drain-gate connecting layers and the first wiring layer are formed in a layer at the same level.

The peripheral circuit portion includes circuits and others which are formed around the memory cell portion, for controlling or driving the memory cell portion or for operating with the memory cell. As examples of the peripheral circuit portion, an address decoder, sense amplifier, address buffer, control circuit, microcomputers such as an MCU or MPU, and the like can be given.

According to the semiconductor device of the present invention, the first and second gate-gate connecting layers are formed over the semiconductor substrate, the first and second drain-drain connecting layers are formed over the first interlayer dielectric, and the first and second drain-gate connecting layers are formed over the second interlayer dielectric, wherein a flip-flop is formed in the memory cell by these three layers. Therefore, the patterns of these layers can be simplified in comparison with a case of forming a flip-flop using two layers, thereby achieving miniaturization of the semiconductor device.

In the present invention, the term "formed in a layer at the same level" mainly means that the layers are formed in the same step. According to this configuration, the drain-gate connecting layers and the first wiring layer are formed in a layer at the same level in the same step, thereby reducing production costs.

Each of the memory cells may include an upper wiring layer formed over a third interlayer dielectric; the peripheral circuit portion may include the third interlayer and a second wiring layer formed over the third interlayer dielectric; and the upper wiring layer and the second wiring layer may be formed in a layer at the same level. This configuration can further increase the above effects. In this case, the upper wiring layer may be used as a bitline wiring layer.

The semiconductor device of the present invention has modifications as follows.

(1) Each of the first and second drain-drain connecting layers may have a thickness of 50–200 nm and a sheet resistance of 50 $\Omega/\square$ or less. According to this configuration, a drain-drain connecting layer having a thickness and resistance appropriate to the use of the device can be obtained. If the drain-drain connecting layers have the above thickness, the focus margin can be increased when patterning the drain-drain connecting layers. This increases the wiring density and yield of the drain-drain connecting layers.

(2) The semiconductor memory device may further comprise first contact portions formed in the first interlayer dielectric, second contact portions formed in the second interlayer dielectric, and third contact portions formed through the first interlayer dielectric and second interlayer dielectric. If there are provided the third contact portions, it is not necessary to form connecting layers which connect the first contact portions to the second contact portions. Therefore, in a minute region, a degree of freedom relating to the location of the contact portions can be ensured by forming the third contact portions, thereby enabling the memory size to be reduced.

In this modification, the first and second gate-gate connecting layers may be connected to the first and second drain-drain connecting layers by the first contact portions.

Moreover, the first and second gate-gate connecting layers may be connected to the first and second drain-gate connecting layers by the third contact portions.

In this modification, first contact pad layers may be formed in the same step of forming the first and second drain-drain connecting layers and used to connect the upper wiring layer to source/drain regions of the access transistors. The second contact portions may be formed over the first contact portions with the first contact pad layers interposed.

The contact pad layer is a conductive layer formed between two contact portions stacked in the direction perpendicular to the surface of the semiconductor substrate over which the transistors are formed. According to this configuration, the second contact portions can be securely connected to the first contact portions.

In this case, the second contact portions may be formed over the first and second drain-drain connecting layers and connect the first and second drain-drain connecting layers to the first and second drain-gate connecting layers.

Contact holes in the third contact portions may have an aspect ratio of preferably 6 or less, and still more preferably 5 or less. The aspect ratio is the ratio of the depth of a contact hole to the lower end diameter of the contact hole. According to this configuration, opening can be formed securely in contact portions with a small diameter, whereby the drain-drain connecting layers can be connected to the drain-gate connecting layers.

(3) Each of the first and second drain-drain connecting layers may include a refractory metal nitride layer. According to this configuration, a thinner layer can be formed whereby processing with higher accuracy can be ensured. Such a thinner layer increases the focus margin when patterning the layer due to small difference in the steps, thereby increasing the wiring density and yield of the drain-drain connecting layers.

In this case, each of the first and second drain-drain connecting layers may further include a refractory metal layer. According to this configuration, the drain-drain connecting layers can be provided with lower resistance, and the thickness thereof can be decreased.

(4) An insulating layer containing silicon nitride and silicon oxide may be formed over the semiconductor substrate. According to this configuration, effects caused by the deviation of the positions of the first contact portions formed over the semiconductor substrate can be decreased for reasons to be described later.

(5) The distance between the semiconductor substrate and the first and second drain-drain connecting layers may be preferably 300 to 1000 nm, and still more preferably 600 to 800 nm. The distance between the first and second drain-drain connecting layers and the first and second drain-gate connecting layers may be preferably 200 to 600 nm, and still more preferably 300 to 500 nm. The distance between the semiconductor substrate and the first and second drain-gate connecting layers may be preferably 1400 nm or less. According to this configuration, the memory cell can be miniaturized.

The semiconductor device of the present invention may further comprise other circuit regions. In this case, the other circuit regions may include a logic circuit. A memory circuit such as a flash memory, cell base circuit, or ROM, a reduced instruction set computer (RISC), intellectual property (IP) macro, an analog circuit and the like can be given as examples. According to this configuration, isolation regions, gate insulating layers, gate electrodes, interlayer dielectrics, wiring layers and the like in the other circuit regions can be formed in the same step of forming the memory cell portion, thereby reducing the number of fabrication steps.

According to a second aspect of the present invention, there is provided a method of fabricating a semiconductor device in which a memory cell portion having memory cells each of which includes two load transistors, two driver transistors and two access transistors, and a peripheral circuit portion which includes MOS transistors are respectively formed in predetermined regions of a semiconductor substrate, the method comprising the steps of:

(a) forming a gate-gate connecting layer over the semiconductor substrate within a region of the memory cells and forming a gate electrode layer over the semiconductor substrate within a region of the peripheral circuit portion;

(b) forming a first interlayer dielectric over the semiconductor substrate within a region of the gate electrode layer and the gate-gate connecting layer;

(c) forming a drain-drain connecting layer over part of the first interlayer dielectric within a region of the memory cells;

(d) forming a second interlayer dielectric over the first interlayer dielectric; and (e) forming a drain-gate connecting layer over the second interlayer dielectric within a region of the memory cells and forming a first wiring layer over the second interlayer dielectric within a region of the peripheral circuit portion.

According to this method of fabricating a semiconductor device, circuits having different functions can be fabricated in a further miniaturized semiconductor device with high accuracy. Moreover, a semiconductor device can be fabricated at high yield.

The method of fabricating a semiconductor device of the present invention has modifications as follows.

(1) The method may further comprise the steps of:

(f) forming a third interlayer dielectric over the second interlayer dielectric; and (g) forming an upper wiring layer over the third interlayer dielectric within a region of the memory cells, and forming a second wiring layer over the third interlayer dielectric within a region of the peripheral circuit portion.

According to this method, the drain-gate connecting layers of the memory cell and the first wiring layer in the peripheral circuit portion can be formed in the same step, and the upper wiring layer of the memory cell and the second wiring layer in the peripheral circuit portion can be formed in the same step. Therefore, the number of steps can be decreased, thereby reducing production costs.

(2) An insulating layer containing silicon nitride and silicon oxide may be formed over the semiconductor substrate after the step (a).

(3) The method may further comprise the steps of:
(h) forming first contact portions in the first interlayer dielectric;
(i) forming third contact portions through the first interlayer dielectric and the second interlayer dielectric; and
(j) forming second contact portions in the second interlayer dielectric.

According to this method of fabricating a semiconductor device, a semiconductor device having miniaturized memory cells can be fabricated with high accuracy.

In this case, first contact pad layers which connect the first contact portions to the second contact portions may be formed over the first interlayer dielectric together with the first and second drain-drain connecting layers in the step (c).

DETAILED DESCRIPTION OF THE PREFERRED EMBODIMENT

Figure 1:
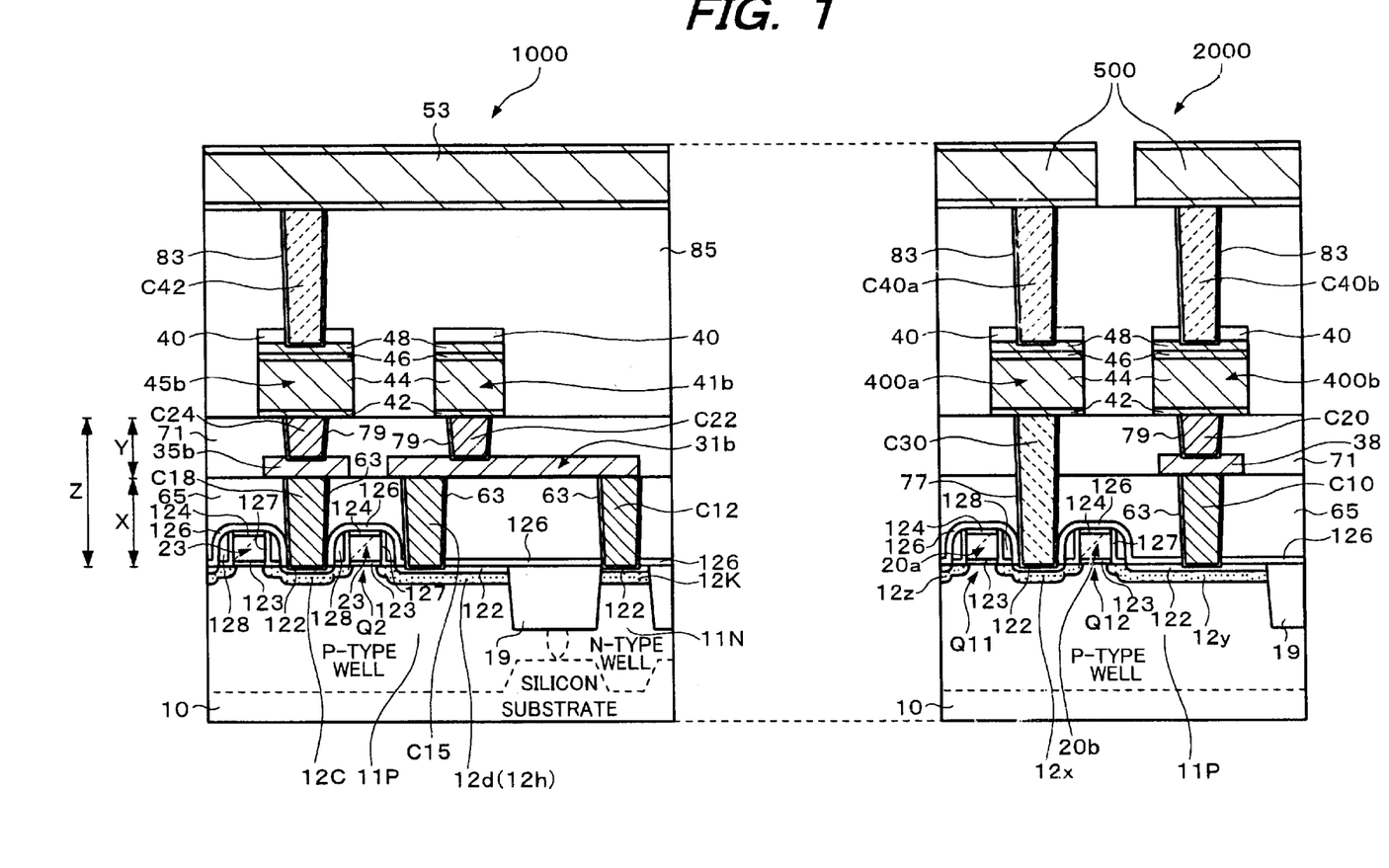
FIG. 1 is a cross section showing a semiconductor device according to an embodiment of the present invention.
Figure 3:
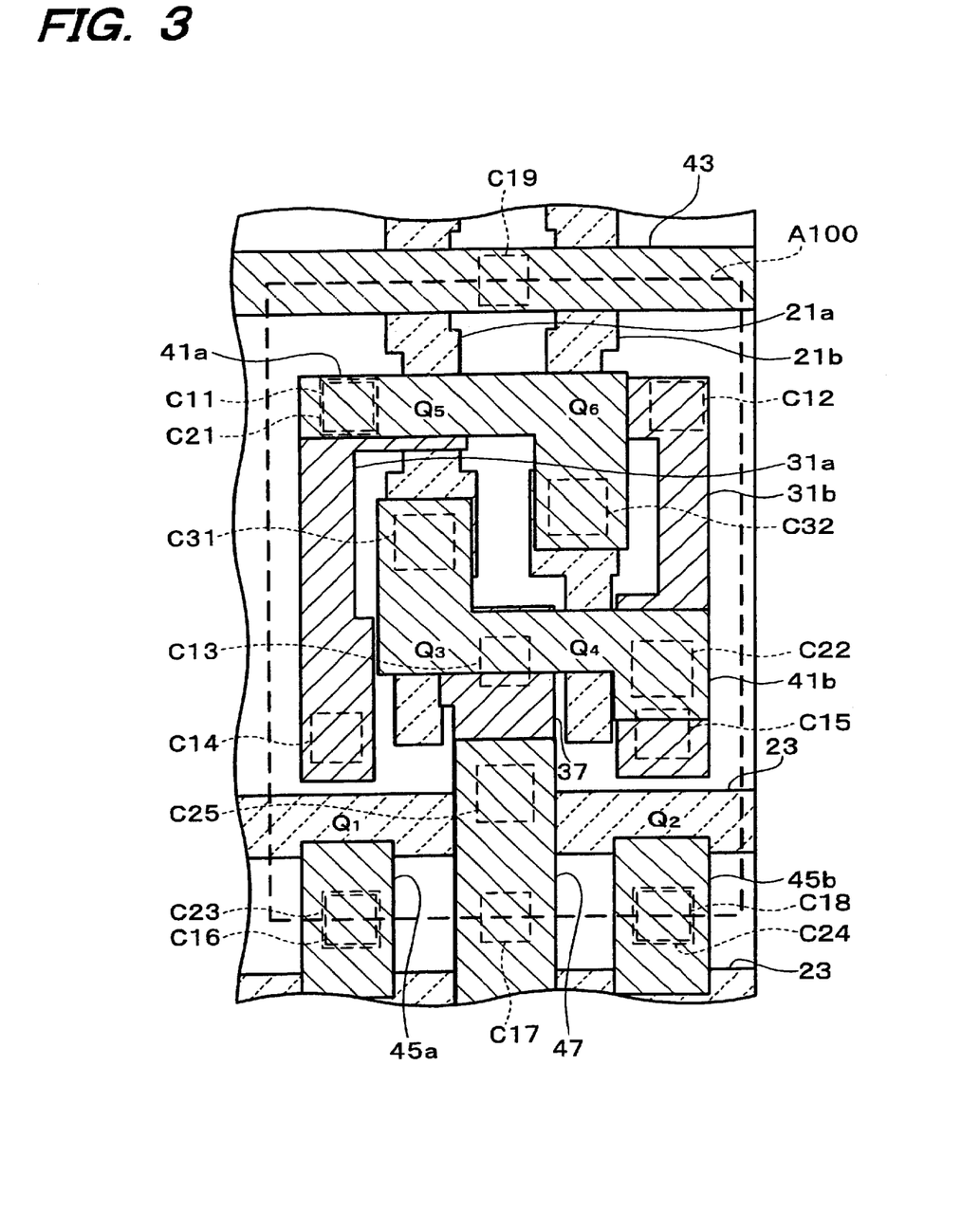
FIG. 3 is an enlarged plan view showing a region A100 of a memory cell shown in FIG. 2.
Figure 4:
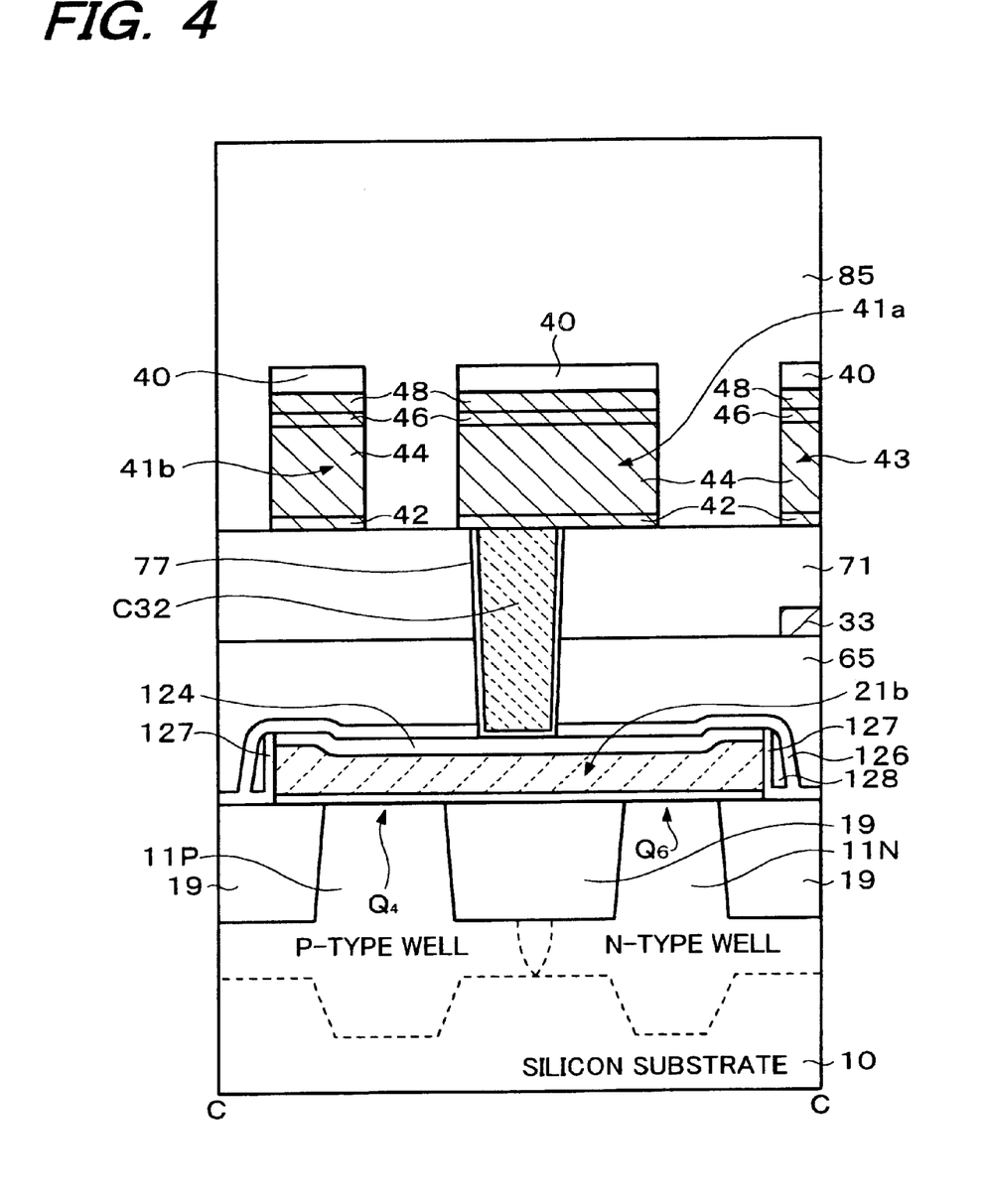
FIG. 4 is a cross section of the memory cell taken along the line C—C of FIG. 2.
Figure 5:
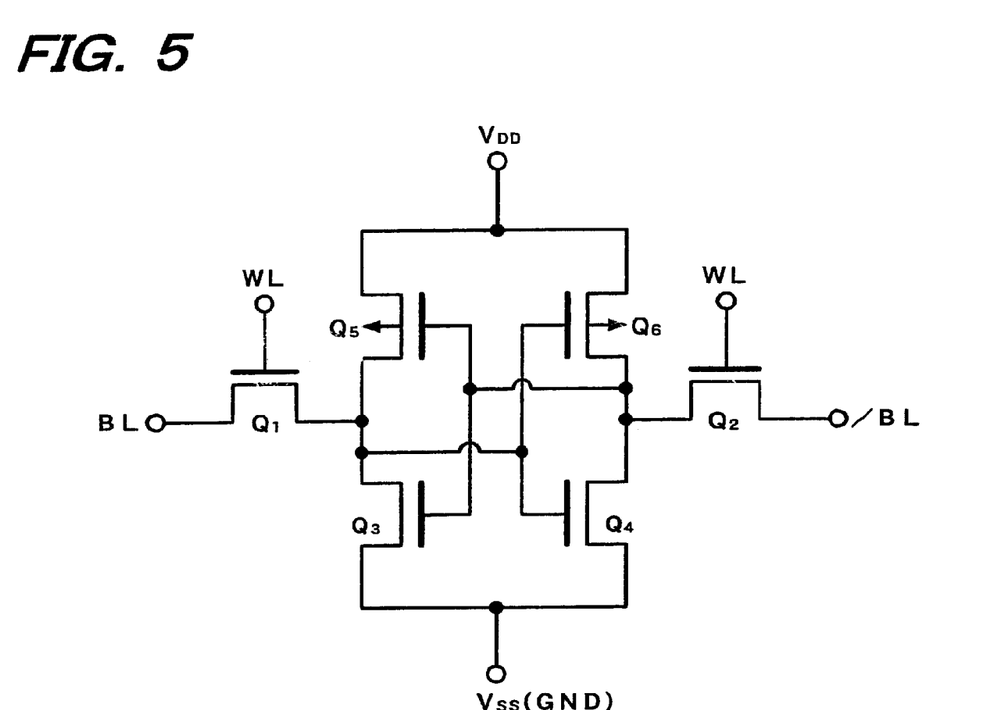
FIG. 5 is an equivalent circuit of the SRAM.
Figure 6:
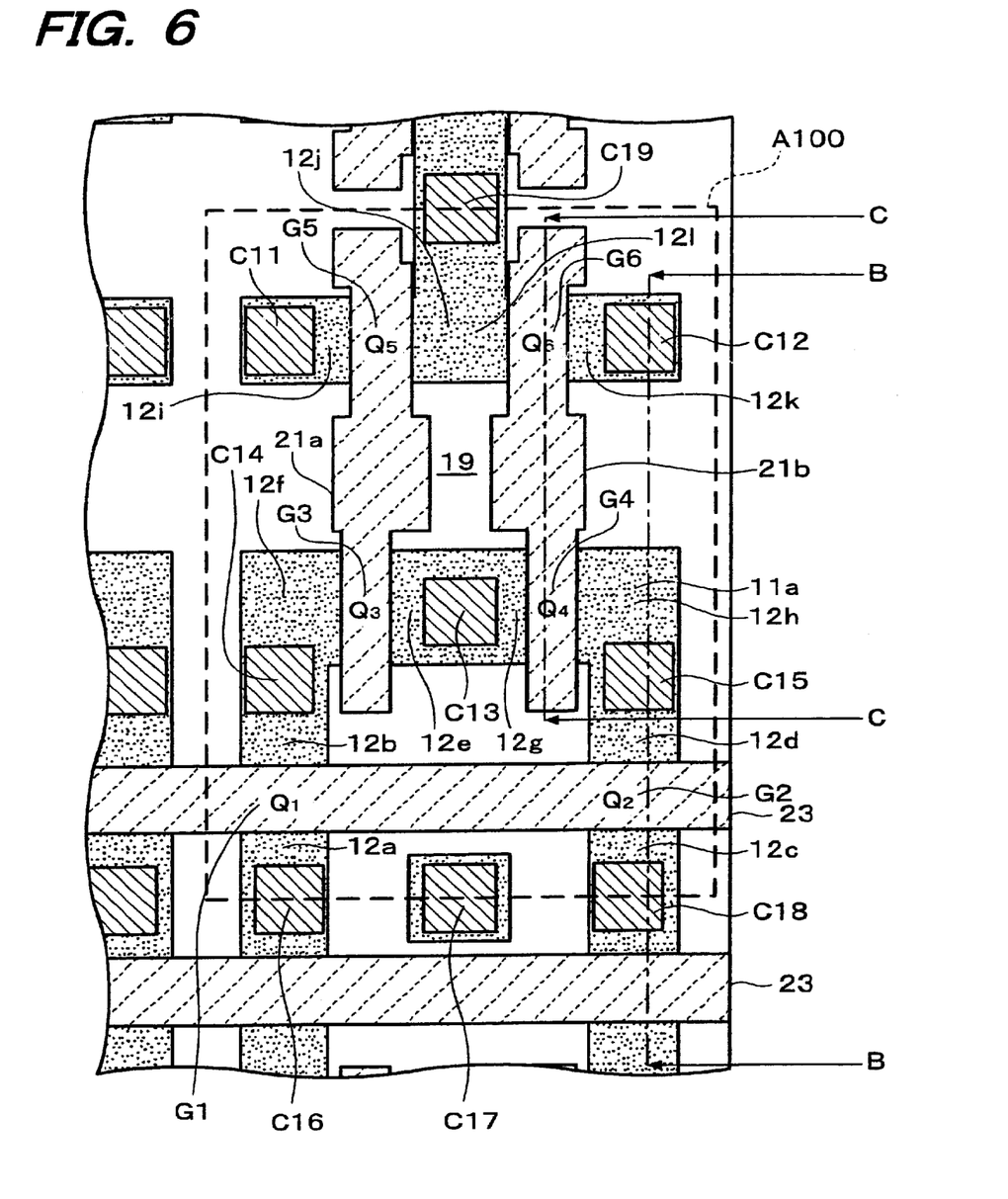
FIG. 6 is a plan view showing gate-gate connecting layers and source/drain regions of the memory cell of FIG. 2.
Figure 7:
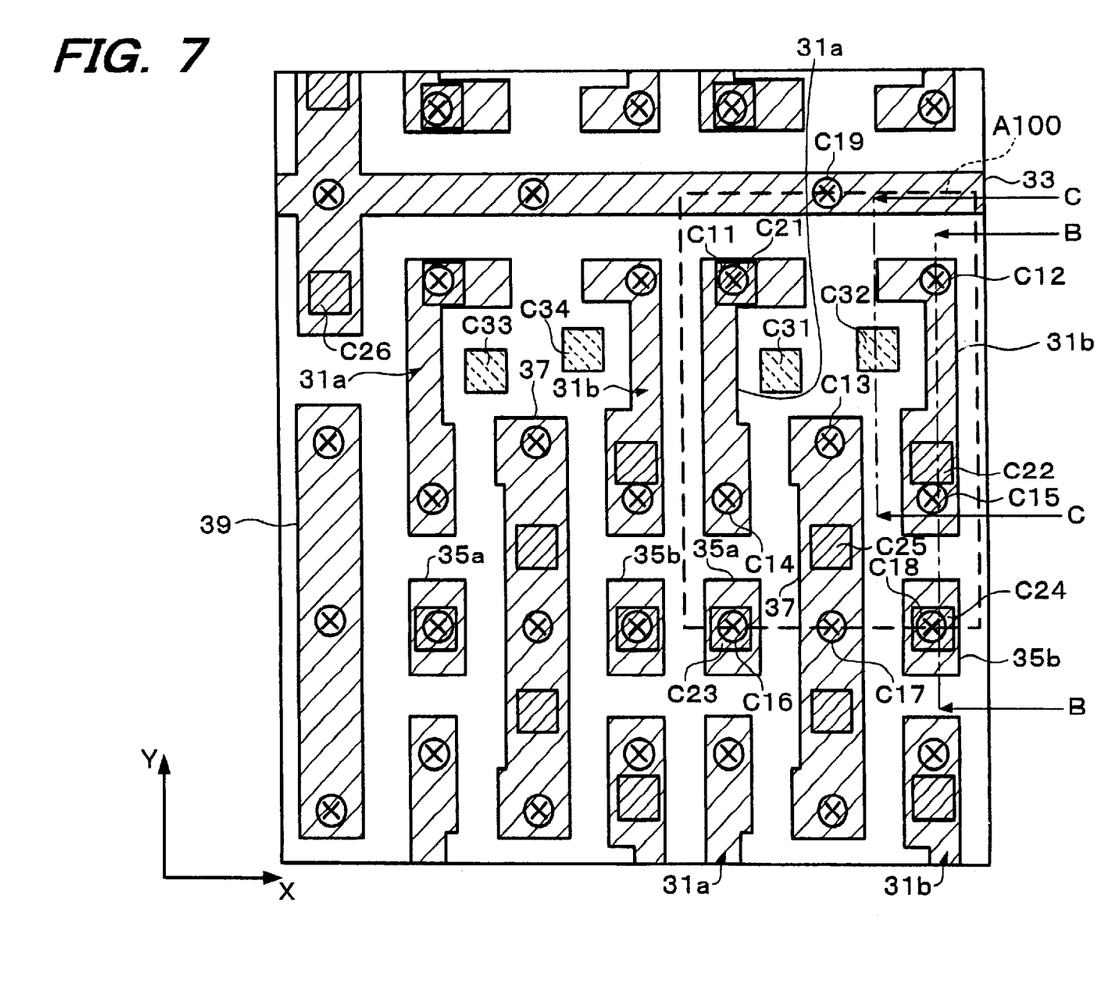
FIG. 7 is a plan view showing drain-drain connecting layers of the memory cell of FIG. 2.
Figure 8:
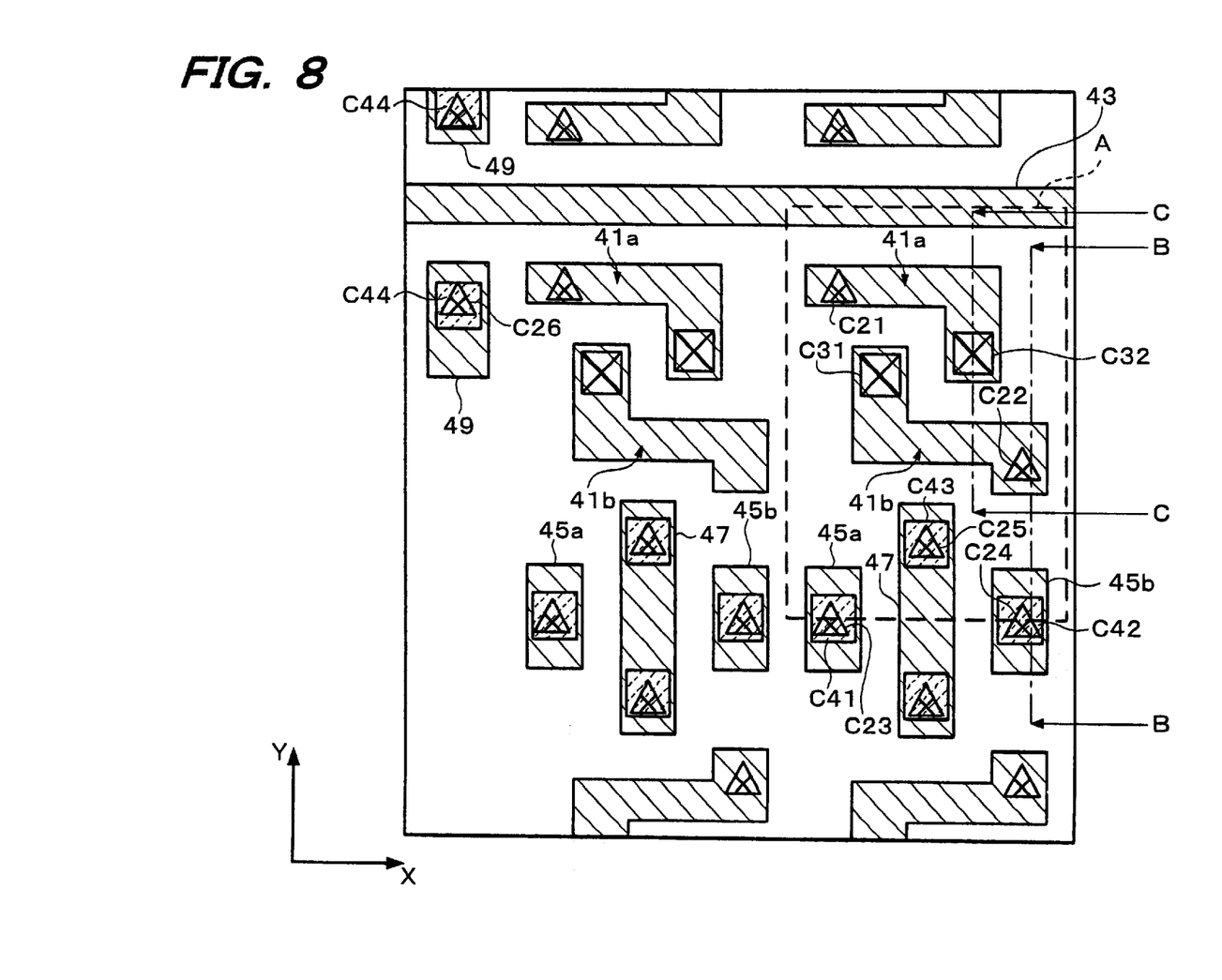
FIG. 8 is a plan view showing drain-gate connecting layers of the memory cell of FIG. 2.
Figure 9:
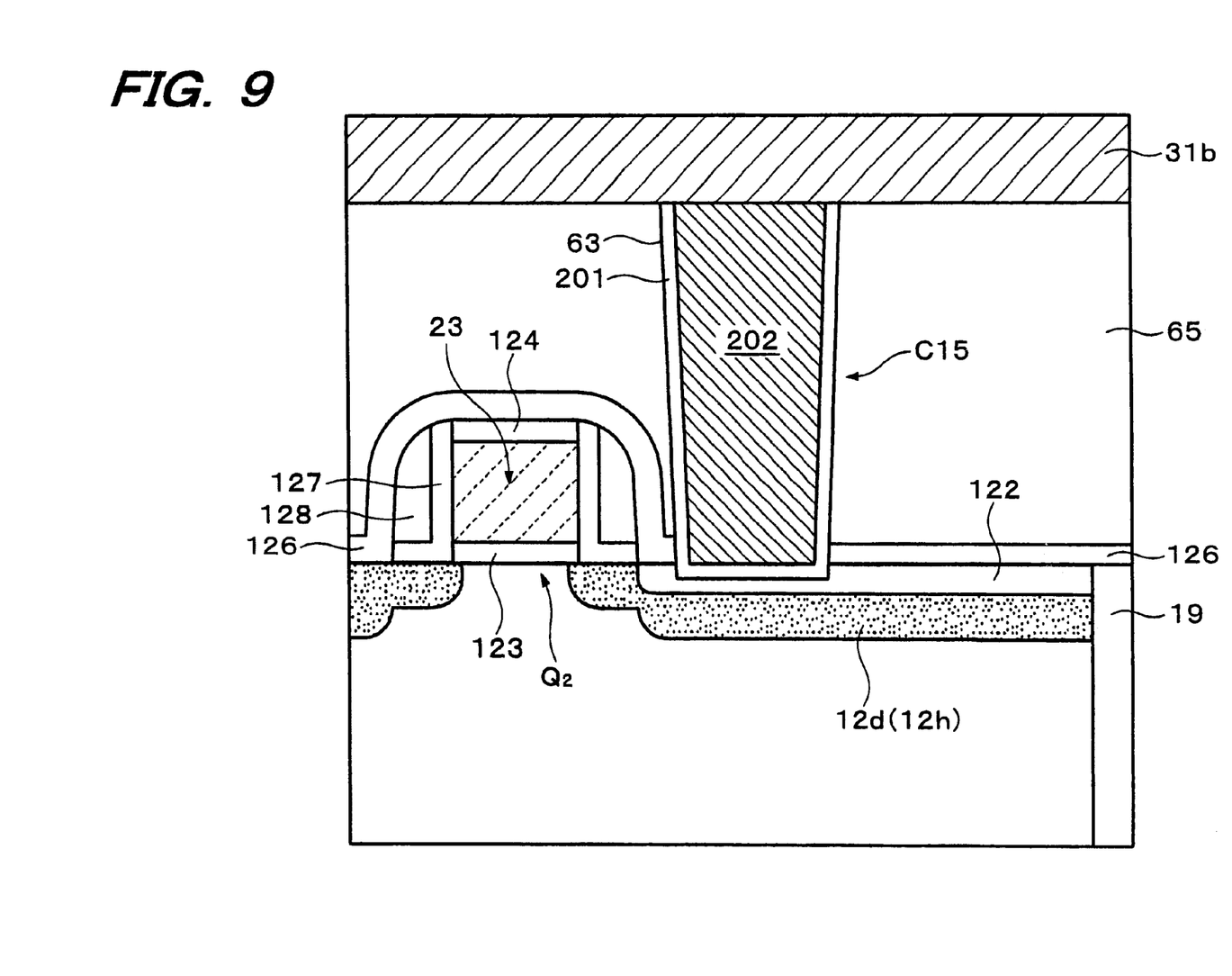
FIG. 9 is an enlarged cross-section of a contact portion C15 of FIG. 1.

An embodiment of the semiconductor device according to the present invention will be described below. The semiconductor device according to the present embodiment has a memory cell portion 1000 and a peripheral circuit portion 2000. The memory cell portion 1000 includes a memory cell array of a full CMOS SRAM. FIG. 1 is a cross section showing a semiconductor device according to the present embodiment. FIGS. 2 and 3 and FIGS. 6 to 8 are plan views showing the memory cell portion 1000 formed in the semiconductor device according to the present embodiment. FIG. 3 is an enlarged view of a region A100 shown in FIG. 2. FIG. 6 is a view showing a lower layer (including active region etc.) of the region shown in FIG. 3. FIG. 4 is a cross section taken along the line C—C of FIG. 2. FIG. 9 is an enlarged cross section showing a first contact portion C15 of FIG. 1. FIG. 5 is an equivalent circuit of the SRAM.

Device Structure

Figure 2:
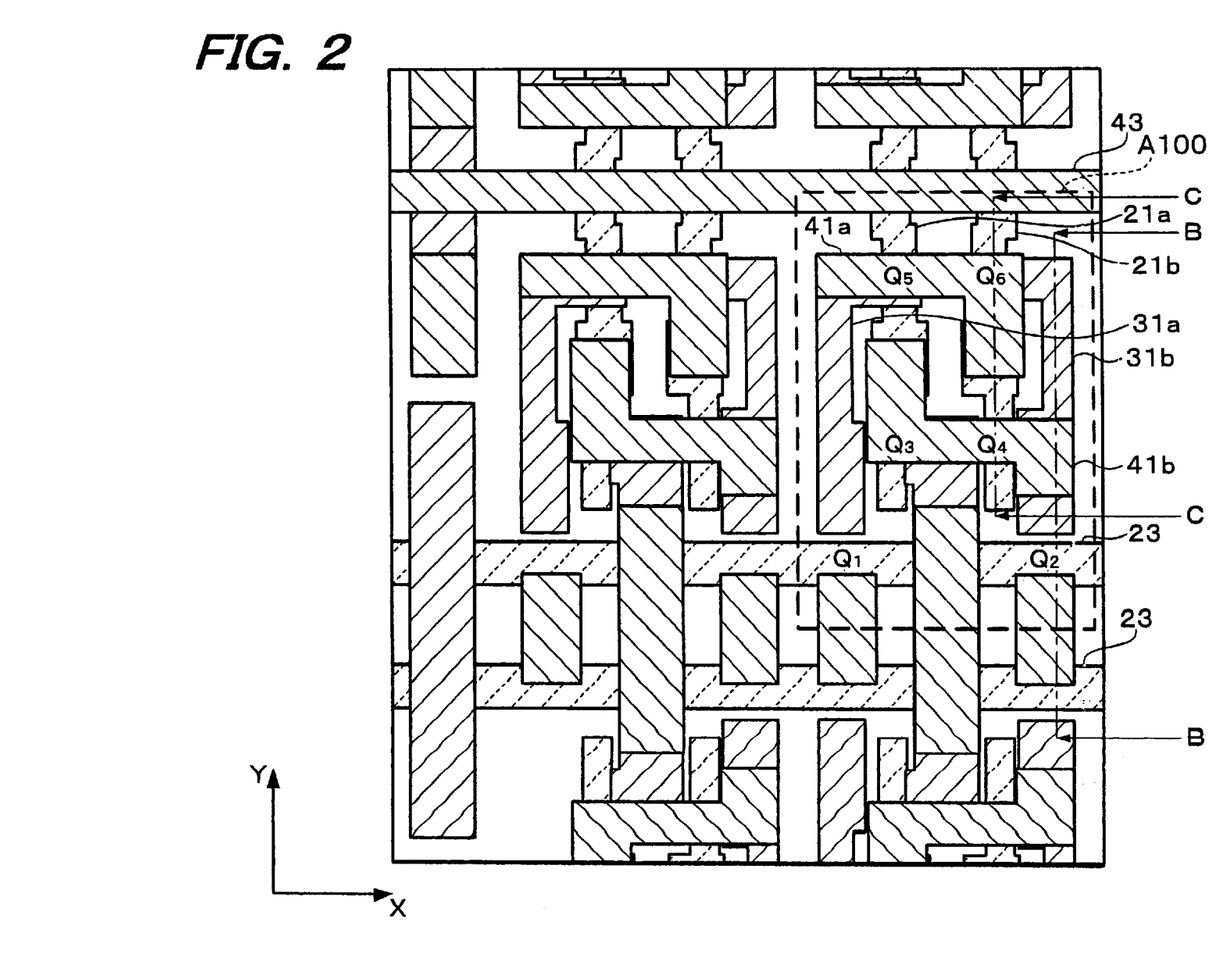
FIG. 2 is a plan view showing a memory cell portion of the semiconductor device of FIG. 1.

In the memory cell portion 1000, one memory cell includes six MOS transistors $Q_1$ to $Q_6$ (see FIG. 2).

Figure 10:
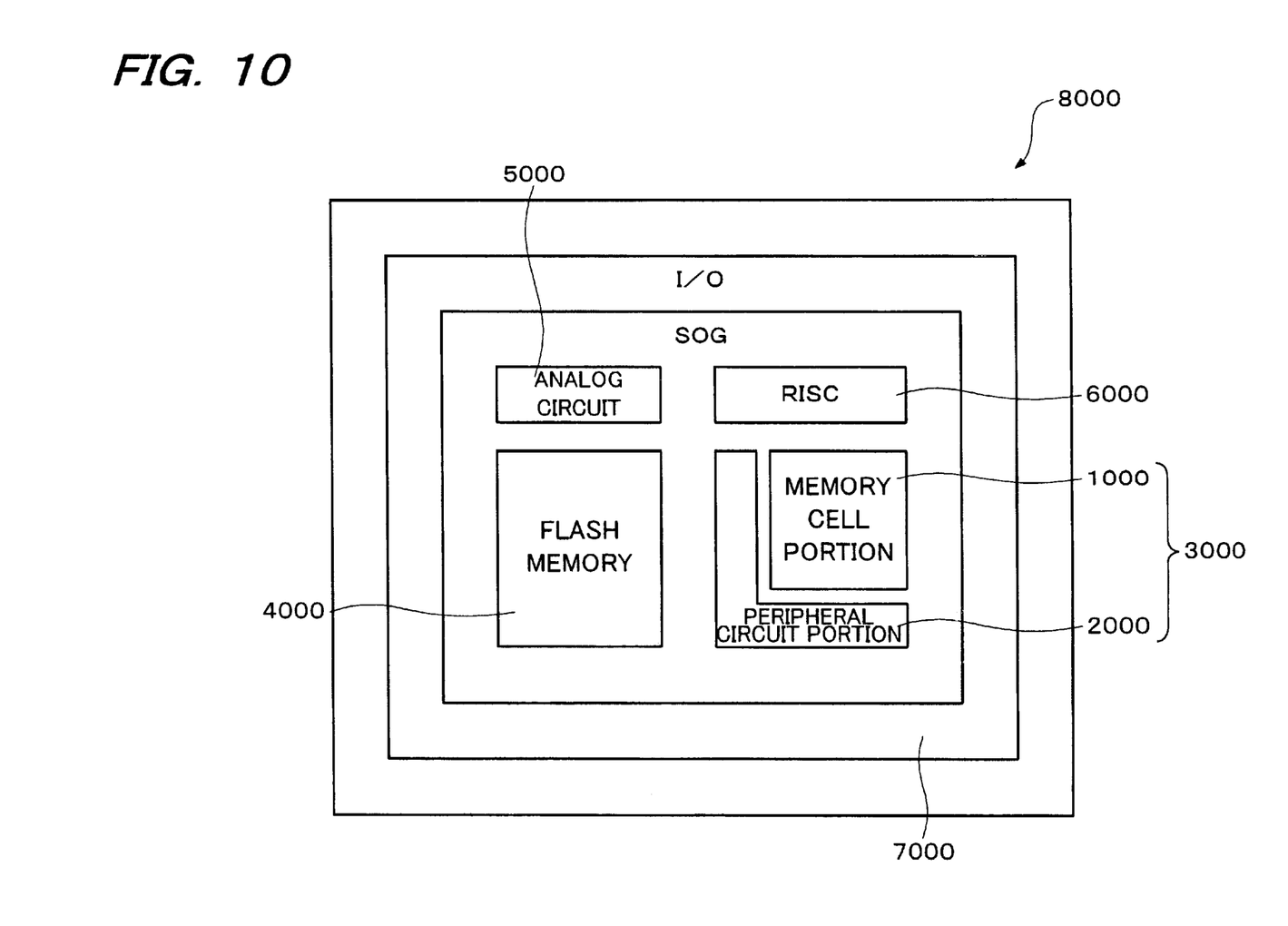
FIG. 10 is a block diagram showing an embedded semiconductor device as an example of a semiconductor device having other circuit regions according to the present invention.

A peripheral circuit portion 2000 is disposed around the memory cell portion 1000 and has at least a MOS transistor as shown in FIG. 10, for example. FIG. 1 shows MOS transistors $Q_{11}$ and $Q_{12}$ in the peripheral circuit portion 2000 of the present embodiment.

1. Planar structure

The planar structure of the memory cell portion 1000 will be described mainly referring to FIG. 2.

(1) FIG. 2 is a plan view showing a first conductive layer, second conductive layer, and third conductive layer of the memory cell portion 1000 according to the present embodiment. FIG. 3 is an enlarged view of the region A100 shown in FIG. 2. The memory cell portion 1000 has a structure in which the first conductive layer, second conductive layer, and third conductive layer are stacked over a silicon substrate 10 (described later) in that order and an interlayer dielectric is provided on each conductive layer. The first conductive layer includes gate-gate connecting layers 21a and 21b formed of polysilicon and a sub-word wiring layer (or sub-word line) 23, as shown in FIG. 6. The second conductive layer includes drain-drain connecting layers 31a and 31b and others, as shown in FIG. 7. The third conductive layer includes drain-gate connecting layers 41a and 41b and others, as shown in FIG. 8. The structure shown in FIG. 7 is positioned on the structure shown in FIG. 6, and the structure shown in FIG. 8 is positioned on the structure shown in FIG. 7. FIG. 1 shows these structures collectively.

FIG. 2 shows a portion which mainly forms a flip-flop. The region A100 in this portion will be described. The region A100 shows a region in which one memory cell is formed in FIG. 1, as well as in other figures. An equivalent circuit of the CMOS SRAM consisting of six transistors in the region A100 is shown in FIG. 5.

In the region A100, six transistors $Q_1$ to $Q_6$ are provided in each memory cell as shown in FIGS. 1, 2, and 5. Active regions are formed in an N-type well 11N (see FIG. 1). The load transistor $Q_5$ is formed in one active region and the load transistor $Q_6$ is formed in another active region. Active regions are also formed in a P-type well 11P (see FIG. 1). The access transistor $Q_1$ and the driver transistor $Q_3$ are formed in one active region. The access transistor $Q_2$ and the driver transistor $Q_4$ are formed in another active region.

The driver transistor $Q_3$ and the load transistor $Q_5$ form a CMOS inverter and the driver transistor $Q_4$ and the load transistor $Q_6$ also form a CMOS inverter. The flip-flop circuit is formed by connecting these inverters.

(2) The gate-gate connecting layers 21a and 21b in the first conductive layer respectively have linear patterns, as shown in FIGS. 2, 3 and 6. The intersections of each of the gate-gate connecting layers 21a and 21b and the sub-word wiring layer 23 with the active regions respectively form gate electrodes G1, G2, G3, G4, G5, and G6, as shown in FIG. 6. Specifically, the gate-gate connecting layer 21a connects the gate electrode G3 of the driver transistor $Q_3$ with the gate electrode G5 of the load transistor $Q_5$. The gate-gate connecting layer 21b connects the gate electrode G4 of the driver transistor $Q_4$ with the gate electrode G6 of the load transistor $Q_6$. The gate lengths of the driver transistors $Q_3$ and $Q_4$ are 0.18 μm, for example. The gate lengths of the load transistors $Q_5$ and $Q_6$ are 0.20 μm, for example.

The sub-word wiring layer 23 is activated or deactivated by a main word wiring layer (main word line) 43 formed thereon. The sub-word wiring layer 23 connects the gate electrodes G1 and G2 of the access transistors $Q_1$ and $Q_2$. The gate lengths of these transistors are 0.24 μm, for example.

(3) The drain-drain connecting layers 31a and 31b in the second conductive layer respectively have linear patterns as shown in FIGS. 2, 3 and 7, and connect the drains of each CMOS. The drain-drain connecting layers 31a and 31b are formed on a first interlayer dielectric 65 (described later; see FIG. 1) over the silicon substrate 10. First contact portions C11 to C19 (hereinafter called "contact portions C11 to C19") are formed in the first interlayer dielectric 65.

The drain-drain connecting layer 31a connects a drain region 12f of the driver transistor $Q_3$ to a drain region 12i of the load transistor $Q_5$ with the contact portions C14 and C11 interposed. The drain-drain connecting layer 31b connects a drain region 12h of the driver transistor $Q_4$ to a drain region 12k of the load transistor $Q_6$ with the contact portions C15 and C12 interposed.

First contact pad layers 35a and 35b and a $V_{SS}$ local wiring layer 37 are formed in a layer at the same level in which the drain-drain connecting layers 31a and 31b are formed so that the first contact pad layers 35a and 35b and the $V_{SS}$ local wiring layer 37 are stacked over the contact portions C11 to C19, as shown in FIG. 7. The drain-drain connecting layers 31a and 31b, first contact pad layers 35a and 35b, and $V_{SS}$ local wiring layer 37 form the second conductive layer. These layers are formed of, for example, a refractory metal layer, a refractory metal nitride layer, a layer of stacked metal and refractory metal, or a layer of stacked refractory metal and refractory metal nitride. Specific examples include titanium, titanium nitride, a layer of stacked titanium and aluminum, and a layer of stacked titanium and titanium nitride.

(4) The drain-gate connecting layers 41a and 41b in the third conductive layer are formed on a second interlayer dielectric 71 (described later; see FIG. 1) as shown in FIGS. 2, 3 and 8. Second contact portions C21 to C26 (hereinafter called "contact portions C21 to C26") are formed in the second interlayer dielectric 71. Third contact portions C31 and C32 (hereinafter called "contact portions C31 and C32") are formed through the first interlayer dielectric 65 and the second interlayer dielectric 71.

The gate-gate connecting layer 21a and the drain-drain connecting layer 31b are connected by the drain-gate connecting layer 41b with the contact portions C22 and C31 interposed. The gate-gate connecting layer 21b and the drain-drain connecting layer 31a are connected by the drain-gate connecting layer 41a with the contact portions C21 and C32 interposed.

Second contact pad layers 45a and 45b, a $V_{SS}$ contact pad layer 47, and a $V_{DD}$ contact pad layer 49 are formed in a layer at the same level in which the drain-gate connecting layers 41a and 41b are formed, as shown in FIG. 8. The second contact pad layers 45a and 45b, $V_{SS}$ contact pad layer 47, and $V_{DD}$ contact pad layer 49 are respectively formed to be stacked on the contact portions C23 to C26. In addition, fourth contact portions C41 to C44 (hereinafter called "contact portions C41 to C44") are formed over these layers. The contact portion C41 is formed to connect a bitline wiring layer (orbit line) to a source/drain region 12a of the access transistor $Q_1$. The contact portion C42 is formed to connect a bitline wiring layer (or bit line BL) 53 as an upper wiring layer (see FIG. 3) to a source/drain region 12c of the access transistor $Q_2$. Note that a source/drain region functions as either a source or a drain. The contact portion C43 is formed to connect the P-type well 11P (see FIG. 3) to a $V_{SS}$ wiring layer (not shown). The contact portion C44 is formed to connect the N-type well 11N (see FIG. 3) to a $V_{DD}$ wiring layer (not shown).

2. Cross-sectional Structure

The cross-sectional structure of the semiconductor device according to the present embodiment will be described with reference to FIGS. 1, 4, and 6.

(1) FIG. 1 shows the memory cell portion 1000 and the peripheral circuit portion 2000 formed over the silicon substrate 10. The memory cell portion 1000 is shown on the left side of FIG. 1 and the peripheral circuit portion 2000 is shown on the right side. FIG. 4 shows a cross section of the memory cell portion 1000 taken along the line B—B of FIG. 2.

In the memory cell portion 1000, the gate-gate connecting layers 21a and 21b, drain-drain connecting layers 31a and 31b, and drain-gate connecting layers 41a and 41b are formed over the silicon substrate 10 in that order and an interlayer dielectric is provided on each of these layers. In the peripheral circuit portion 2000, first wiring layers 400a and 400b and a second wiring layer 500 are formed over the silicon substrate 10.

(2) The N-type well 11N, P-type well 11P, and isolation region 19 are formed on the silicon substrate 10, as shown in FIGS. 1 and 6. Source/drain regions 12a to 12l are formed on the silicon substrate 10 within a region of the memory cell portion 1000. Source/drain regions 12x to 12z are formed on the silicon substrate 10 within a region of the peripheral circuit portion 2000. The P-type well lip and the N-type well 11N are electrically isolated by the isolation region 19 (having a thickness of 400 nm, for example). The isolation region 19 is also formed around the active regions of the MOS transistor.

In the memory cell portion 1000, the drain region 12k of the load transistor $Q_6$ is formed in the N-type well 11N. The drain region 12h of the driver transistor $Q_4$ and the source/drain region 12d of the access transistor $Q_2$ are formed in the P-type well 11P. In the peripheral circuit portion 2000, the source/drain region 12x of the transistors $Q_{11}$ and $Q_{12}$, the source/drain region 12y of the transistor $Q_{12}$, and the source/drain region 12z of the transistor $Q_{11}$ are formed in the P-type well 11P. A silicide layer 122 is formed on each of the source/drain regions 12a to 12l and 12x to 12z. An insulating layer 126 of silicon nitride is formed on the silicide layer 122.

(3) The sub-word wiring layer 23 is formed on the P-type well 11P in the memory cell portion 1000. The first interlayer dielectric 65 is formed over the silicon substrate 10. The contact portions C18, C15, and C12 respectively connected to the source/drain regions 12c, 12d (12h), and 12k are formed in the first interlayer dielectric 65. In the peripheral circuit portion 2000, the gate electrode layers 20a and 20b are formed over the P-type well 11P, and the first interlayer dielectric 65 is formed over the silicon substrate 10 in the same manner as in the memory cell portion 1000.

(4) FIG. 9 shows an enlarged view of a region including the contact portion C15 in the memory cell portion 1000 as an example of the first contact portions.

The silicide layer 122 is formed on the source/drain region 12d (12h). The contact portion C15 is formed of a refractory metal nitride layer 201 connected to the silicide layer 122, and a plug layer 202 formed on the refractory metal nitride layer 201 within a first contact hole 63. The plug layer 202 is formed of tungsten or the like. The refractory metal nitride layer 201 mainly functions as a barrier layer. The first contact hole 63 preferably has an aspect ratio of 6 or less, upper end diameter of 0.22 to 0.32 µm, and lower end diameter of 0.22 to 0.26 µm. For example, the first contact hole 63 is formed so that the upper end diameter is 0.30 µm, lower end diameter is 0.24 µm, and the aspect ratio is 3 or less.

(5) In the memory cell portion 1000, the drain-drain connecting layer 31b which connects the drain region 12h of the driver transistor $Q_4$ to the drain region 12k of the load transistor $Q_6$ and the first contact pad layer 35b are formed on the first interlayer dielectric 65, as shown in FIG. 1. The first contact pad layer 35b is formed in the same step in which the drain-drain connecting layer 31b is formed. The first contact pad layer 35b is connected to the source/drain region 12c of the access transistor $Q_2$ with the contact portion C18 interposed. The drain-drain connecting layer 31b has a thickness of preferably 50 to 200 nm, and still more preferably 100 to 150 nm. These layers have a sheet resistance of preferably 50 Ω/□ or less, and still more preferably 15 Ω/□ or less.

(6) In the memory cell portion 1000 and the peripheral circuit portion 2000, the second interlayer dielectric 71 is formed on the first interlayer dielectric 65. The contact portions C22 and C24 are formed in the second interlayer dielectric 71 in the memory cell portion 1000. The second contact portions such as the contact portions C22 and C24 have the same configuration as the first contact portions, and are formed by filling a second contact hole 79 with a plug layer formed of tungsten or the like. Note that the second contact hole 79 preferably has an aspect ratio of 6 or less, upper end diameter of 0.22 to 0.32 µm, and lower end diameter of 0.22 to 0.26 µm. For example, the second contact hole 79 is formed so that the upper end diameter is 0.30 µm, lower end diameter is 0.24 µm, and the aspect ratio is 3 or less. In the peripheral circuit portion 2000, a third contact portion C30 (hereinafter called "contact portion C30") connected to the source/drain region 12x is formed through the first interlayer dielectric 65 and the second interlayer dielectric 71. A first contact portion C10 (hereinafter called "contact portion C10") is formed in the first interlayer dielectric 65 and a second contact portion C20 (hereinafter called "second portion C20") is formed in the second interlayer dielectric 71. The contact portions C10 and C20 connect the source/drain region 12x to the first wiring layer 400b with a contact pad layer 38 interposed.

(7) The drain-gate connecting layer 41b is formed on the second interlayer dielectric 71 in the memory cell portion 1000. The drain-gate connecting layer 41b is connected to the drain-drain connecting layer 31b with the contact portion C22 interposed. The second contact pad layer 45b which connects the contact portion C24 to the contact portion C42 is formed in the same step in which the drain-gate connecting layer 41b is formed. A third interlayer dielectric 85 is formed on the drain-gate connecting layer 41b. The contact portion C42 is formed on the second contact pad layer 45b and through the third interlayer dielectric 85. A bitline wiring layer 53 (or bit line BL shown in FIG. 5) as an upper wiring layer is formed on the third interlayer dielectric 85. The contact portion C42 is connected to the bitline wiring layer 53, whereby the source/drain region 12c of the access transistor $Q_2$ is connected to the bitline wiring layer 53. Signals which flow through the bitline wiring layer 53 and the other bitline wiring layer (bit line BL shown in FIG. 5) complement each other.

The drain-gate connecting layer 41b is formed of, for example, a refractory metal nitride layer 42, a metal layer 44 of aluminum, copper, or alloy thereof, a refractory metal layer 46, and a refractory metal nitride layer 48, which are stacked in that order from the side of the silicon substrate 10. Specifically, the drain-gate connecting layer 41b may be formed by using titanium nitride for the refractory metal nitride layer 42, aluminum for the metal layer 44, titanium for the refractory metal layer 46, and titanium nitride for the refractory metal nitride layer 48. The contact portion C42 has the same configuration as the first contact portions, and is formed by filling a fourth contact hole 83 with a plug layer formed of tungsten or the like. The fourth contact hole 83 preferably has an aspect ratio of 6 or less, upper end diameter of 0.26 to 0.40 µm, and lower end diameter of 0.26 to 0.30 µm. For example, the fourth contact hole 83 is formed so that the upper end diameter is 0.36 µm, lower end diameter is 0.28 µm, and aspect ratio is 3 or less.

A third interlayer dielectric 85 is formed on the second interlayer dielectric 71, and the bitline wiring layer 53 is formed on the third interlayer dielectric 85. The third interlayer dielectric 85 is formed of, for example, silicon oxide, FSG (fluorine-doped silicon oxide), or a layer formed by stacking these compounds.

The first wiring layers 400a and 400b are formed on the second interlayer dielectric 71 in the peripheral circuit portion 2000. The first wiring layers 400a and 400b are formed in a layer at the same level in which the drain-gate connecting layer 41b and the second contact pad layer 45b in the memory cell portion 1000 are formed. The third interlayer dielectric 85 is formed on the first wiring layers 400a and 400b. The contact portion C42 is formed on the second contact pad layer 45b and through the third interlayer dielectric 85. The second wiring layer 500 is formed on the third interlayer dielectric 85. The second wiring layer 500 is formed in a layer at the same level in which the bitline wiring layer 53 of the memory cell portion 1000 is formed.

(8) The cross section the memory cell portion 1000 taken along the line C—C of FIG. 2 will be described with reference to FIGS. 1 and 4. In FIG. 4, the same components as those shown in FIG. 1 are denoted by the same reference numbers, and further description thereof is omitted.

The gate-gate connecting layer 21b is formed on the P-type well 11P and the N-type well 11N which are electrically isolated from each other by the isolation region 19. The driver transistor $Q_4$ and the load transistor $Q_6$ are respectively formed on the P-type well 11P and the N-type well 11N. The driver transistor $Q_4$ is connected to the load transistor $Q_6$ by the gate-gate connecting layer 21b.

The silicide layer 124 and the insulating layer 126 which is formed of silicon nitride or the like are stacked on the gate-gate connecting layer 21b in that order. The first interlayer dielectric 65 and the second interlayer dielectric 71 are formed over the insulating layer 126. The drain-gate connecting layer 41a is formed on the second interlayer dielectric 71. A contact portion C32 is formed through the first interlayer dielectric 65 and the second interlayer dielectric 71. The gate-gate connecting layer 21b is connected to the drain-gate connecting layer 41a by the contact portion C32. The contact portion C32 has the same configuration as the first contact portions, and is formed by filling a third contact hole 77 with a plug layer formed of tungsten or the like. The third contact hole 77 preferably has an aspect ratio of 6 or less, upper end diameter of 0.22 to 0.32 µm, and lower end diameter of 0.22 to 0.26 µm. For example, the third contact hole 77 is formed so that the upper end diameter is 0.32 µm, lower end diameter is 0.24 µm, and aspect ratio is 6 or less.

In the semiconductor device of the present embodiment having the above configuration, the distance X between the silicon substrate 10 and the drain-drain connecting layers 31a and 31b shown in FIG. 1 is preferably 300 to 1000 nm, and still more preferably 600 to 800 nm. The distance Y between the drain-drain connecting layers 31a and 31b and the drain-gate connecting layers 41a and 41b is preferably 200 to 600 nm, and still more preferably 300 to 500 nm. The distance Z between the silicon substrate 10 and the drain-gate connecting layers 41a and 41b is preferably 1400 nm or less. A semiconductor memory device exhibiting sufficient conductivity with a reduced size can be achieved by satisfying these conditions.

3. Electrical Connection of Components

Electrical connection in the components will be described with reference to FIGS. 1, 3, 5, and 6.

(1) The transistors $Q_1$ to $Q_6$ formed in the memory cell portion 1000 will be described.

The access transistor $Q_1$ includes the n$^+$-type source/drain regions 12a and 12b, respectively provided on one side of the sub-word wiring layer 23. The source/drain region 12a is connected to the bitline wiring layer 53 (or bit line BL shown in FIG. 5) through the contact portion C16, first contact pad layer 35a, contact portion C23, second contact pad layer 45a, and contact portion C41.

The access transistor $Q_2$ includes the n$^+$-type source/drain regions 12c and 12d, respectively provided one one side of the sub-word wiring layer 23. The source/drain region 12c is connected to the bitline wiring layer 53 (or bit line BL shown in FIG. 5) through the contact portion C18, first contact pad layer 35b, contact portion C24, second contact pad layer 45b, and contact portion C42.

The driver transistor $Q_3$ includes the n$^+$-type source/drain regions 12e and 12f, respectively provided on one side of the gate-gate connecting layer 21a. The source region 12e is connected to the $V_{SS}$ wiring layer (corresponding to $V_{SS}$ shown in FIG. 5) through the contact portion C13, $V_{SS}$ local wiring layer 37, contact portion C25, $V_{SS}$ contact pad layer 47, and contact portion C43.

The driver transistor $Q_4$ includes the n$^+$-type source/drain regions 12g and 12h, respectively provided on one side of the gate-gate connecting layer 21b. The source region 12g is connected to the $V_{SS}$ wiring layer by the route common to the source region 12e.

The load transistor $Q_5$ includes the p$^+$-type source/drain regions 12i and 12j, respectively provided on one side of the gate-gate connecting layer 21a. The source region 12j is connected to the $V_{DD}$ wiring layer (corresponding to $V_{DD}$ shown in FIG. 5) through the contact portion C19, $V_{DD}$ wiring layer 33, contact portion C26, $V_{DD}$ contact pad layer 49, and contact portion C44.

The load transistor $Q_6$ includes the p$^+$-type source/drain regions 12k and 12l, respectively provided on one side of the gate-gate connecting layer 21b. The source region 12l is connected to the $V_{DD}$ wiring layer by the route common to the source region 12j.

(2) Next, the transistors $Q_{11}$ and $Q_{12}$ formed in the peripheral circuit portion 2000 will be described.

The transistor $Q_{11}$ includes the n$^+$-type source/drain regions 12x and 12y, respectively provided on one side of the gate electrode layer 20a. The transistor $Q_{12}$ includes the n$^+$-type source/drain regions 12y and 12z, respectively provided on one side of the gate electrode layer 20b. The source/drain region 12x is connected to the second wiring layer 500 through the contact portion C30, first wiring layers 400a and 400b, and fourth contact portion C40a (hereinafter called "contact portion C40a"). The source/drain region 12y is connected to the second wiring layer 500 through the contact portion C10, first contact pad layer 38, contact portion C20, first wiring layer 400b, and fourth contact portion C40b (hereinafter called "contact portion C40b").

4. Example of a Semiconductor Device Having Other Circuit Regions

FIG. 10 is a block diagram showing an embedded semiconductor device 8000 as an example of a semiconductor device having other circuit regions. In this example, an SRAM 3000 including the above-described memory cell portion 1000 and peripheral circuit portion 2000, a flash memory (flash EEPROM) 4000, an analog circuit 5000, a RISC 6000, and interface circuit 7000 are formed on a sea of gate (SOG) in the embedded semiconductor device 8000. According to this structure, a gate insulating layer and others in the circuit regions other than the SRAM 3000 can be formed in the same steps of forming those in the SRAM 3000, thereby reducing the number of fabrication steps of semiconductor devices. The embedded semiconductor device 8000 shown in FIG. 10 is only an example, and the present invention can be applied to various other types of system LSIs.

Fabrication Process

An example of the method of fabricating the semiconductor device according to the present embodiment of FIG. 1 will be described with reference to FIGS. 1 to 4.

(1) The isolation region 19 shown in FIGS. 1 and 4 is formed by the shallow trench isolation (STI) method. A silicon oxide layer and a silicon nitride layer are deposited over the P-type silicon substrate 10 in that order. After forming a resist with a predetermined pattern thereon, the silicon substrate 10 is etched, thereby forming grooves. After oxidizing the surface of the exposed grooves, the grooves are filled with a silicon oxide layer by the high density plasma (HDP) method or the like. The silicon oxide layer outside the grooves is planarized by the chemical mechanical polishing (CMP) method. After removing the silicon nitride layer, a resist with a predetermined pattern is formed on the surface of the substrate. The N-type well 11N is then formed in the predetermined position by ion implantation. The P-type well 11P is formed by the same method. Then, the gate insulating layer 123 is formed by thermally oxidizing the surface of the N-type well 11N and the P-type well 11P.

A polysilicon layer is formed on the insulating layer by the CVD method. Part of the polysilicon layer is patterned by photoetching, thereby forming the gate-gate connecting layers 21a and 21b and the sub-word wiring layer 23 in the memory cell portion 1000, and the gate electrode layers 20a and 20b in the peripheral circuit portion 2000.

(2) An insulating layer formed of silicon oxide and silicon nitride is deposited on the sidewalls of the polysilicon layer by the CVD method. The insulating layer is anisotropically etched by dry etching such as RIE, thereby forming sidewall insulating layers 127 and 128 on the sidewalls of the gate electrode layers 20a and 20b, gate-gate connecting layers 21a and 21b, and sub-word wiring layer 23 in the same step.

High-concentration N-type impurities such as phosphorus or arsenic and high-concentration P-type impurities such as boron are respectively introduced into the active region of the P-type well 11P and the active region of the N-type well 11N, using the gate electrode layers 20a and 20b, gate-gate connecting layers 21a and 21b, and sub-word wiring layer 23 as masks, thereby forming the source/drain regions 12a to 12l and 12x to 12z. At this time, the gate electrode layers 20a and 20b, gate-gate connecting layers 21a and 21b, and sub-word wiring layer 23 are also doped with predetermined N-type or P-type impurities.

Then, the silicide layers 122 and 124 containing refractory metal such as titanium or cobalt are formed on the exposed surfaces of the source/drain regions 12a to 12l and 12x to 12z, gate-gate connecting layers 21a and 21b, and the sub-word wiring layer 23 by the conventional salicide technique. A refractory metal nitride layer such as titanium nitride layer may be formed on the silicide layers 122 and 124, as required.

(3) The insulating layer 126 containing silicon nitride, for example, as a major component is formed over the surface of the semiconductor substrate on which the MOS transistors $Q_1$ to $Q_6$, $Q_{11}$ and $Q_{12}$ and the isolation region 19 are formed, on the gate-gate connecting layers 21a and 21b, and on the sub-word wiring layer 23 by the plasma CVD method or the like. The insulating layer 126 functions as a stopper for preventing the lower ends of the first contact portions from contacting the isolation region 19 in the case where the first contact portions deviate from the predetermined positions when forming the first contact portions in a step described later. The first interlayer dielectric 65 is then formed on the insulating layer 126 by the HDP method, ozone tetraethyl orthosilicate (TEOS) method, or the like. The first interlayer dielectric 65 is planarized to a thickness of 300 to 1000 nm by the CMP method, as required. In order to obtain the first interlayer dielectric 65 with a flatter surface, the first interlayer dielectric 65 may be stacked after forming a dummy pattern with the same configuration as the gate-gate connecting layers 21a and 21b in the predetermined region excluding active regions, N-type well 11N, and P-type well 11P and others when forming the gate electrode layers 20a and 20b, the gate-gate connecting layers 21a and 21b and others.

(4) The first contact hole 63 is formed in the predetermined region of the first interlayer dielectric 65 by photoetching. In this step, it is preferable to form a photoresist after forming an organic antireflection film on the first interlayer dielectric 65. This ensures that light will be uniformly irradiated on the first interlayer dielectric 65 during exposure, whereby a precise pattern can be formed with higher accuracy. It is preferable to use a half-tone mask for exposure. A half-tone mask has a mask pattern formed of a translucent film instead of chromium or the like. Use of the half-tone mask provides a phase difference to light which has leaked out from the translucent film, thereby emphasizing the edge of the resist pattern.

The following description is given using the contact portion C15 as an example with reference to FIG. 9. The refractory metal nitride layer 201 such as titanium nitride layer is formed on the inside surface of the first contact hole 63 by sputtering. The plug layer 202 of tungsten or the like is formed within the first contact hole 63. Then, the first contact portion C15 is formed by planarizing the surface of the plug layer 202 in the first contact hole 63 by etching, the CMP method, or a combination of these methods. The contact portions C10 to C14 and C16 to C19 are formed at the same time of the formation of the first contact portion C15.

A refractory metal nitride layer is formed on the plug layer 202 and the first interlayer dielectric 65 by sputtering. The drain-drain connecting layers 31a and 31b, first contact pad layers 35a and 35b, and $V_{SS}$ local wiring layer 37 are formed by patterning the refractory metal nitride layer by photoetching. In this step, it is also preferable to use an organic antireflection film during photoetching.

As the refractory metal nitride layer which forms the drain-drain connecting layers 31a and 31b and others, a nitride layer of a metal selected from titanium, tungsten, cobalt, molybdenum, and the like is preferable. As the plug layer 202, molybdenum, aluminum, doped polysilicon, copper, or the like is used in addition to tungsten.

The drain-drain connecting layers 31a and 31b, first contact pad layers 35a and 35b, and $V_{SS}$ local wiring layer 37 may have a two-layer structure consisting of a refractory metal layer and a refractory metal nitride layer. In this case, these layers are formed by forming a refractory metal layer on the plug layer 202 and the first interlayer dielectric 65, and then forming a refractory metal nitride layer. As the refractory metal, a metal selected from titanium, tungsten, cobalt, molybdenum, and the like is preferable.

(5) An insulating layer is formed on the drain-drain connecting layer 31a and 31b, first contact pad layers 35a and 35b, $V_{SS}$ local wiring layer 37, and first interlayer dielectric 65 by the HDP method, ozone TEOS method, or the like. The surface of the insulating layer may be planarized by the CMP method if necessary, thereby forming the second interlayer dielectric 71.

The third contact hole 77 is formed through the first interlayer dielectric 65 and the second interlayer dielectric 71 in the predetermined region by photoetching. It is preferable to perform photoetching by forming an organic antireflection film on the second interlayer dielectric 71, and by using a half-tone mask. Then, the contact portions C31 and C32 are formed in the third contact hole 77 in the memory cell portion 1000, and the contact portion C30 is formed in the third contact hole 77 in the peripheral circuit portion 2000 by the same method used to form the first contact portions, as shown in FIG. 1.

The contact portions C21 to C26 are formed in the predetermined regions of the second interlayer dielectric 71 by using the same material and method used to form the contact portions C31 and C32. The contact portions C21 to C26 are respectively connected to the drain-drain connecting layers 31a and 31b, first contact pad layers 35a and 35b, and $V_{SS}$ local wiring layer 37, and $V_{DD}$ wiring layer 33. At the same time, the contact portion C20 connected to the first contact pad layer 38 is formed in the predetermined region of the second interlayer dielectric 71 in the peripheral circuit portion 2000.

(6) The succeeding steps may be carried out by conventional methods. For example, the refractory metal nitride layer 42 such as a titanium nitride layer, metal layer 44 of a metal such as aluminum or copper, the refractory metal layer 46 such as a titanium layer, and the refractory metal nitride layer 48 such as a titanium nitride layer are formed on the second interlayer dielectric 71 and the contact portions C20 to C26 by sputtering. After forming a hard mask layer 40, as required, an organic antireflection film is formed thereon. After forming a photoresist with a predetermined pattern, these layers are etched, thereby forming the drain-gate connecting layers 41a and 41b, second contact pad layers 45a and 45b, $V_{SS}$ contact pad layer 47, and $V_{DD}$ contact pad layer 49 in the memory cell portion 1000. In the peripheral circuit portion 2000, the first wiring layers 400a and 400b are formed in the same step of the formation of the drain-gate connecting layer 41a and others. The third interlayer dielectric 85 is then formed over these layers by the HDP method, plasma CVD, or the like. The third interlayer dielectric 85 is preferably formed of silicon oxide, FSG, or a layer formed by stacking these compounds. Then, the contact portions C41 to C44 are formed in the predetermined regions of the second contact pad layers 45a and 45b, $V_{SS}$ contact pad layer 47, and $V_{DD}$ contact pad layer 49. At the same time, the contact portions C40a and C40b are formed on the first wiring layers 400a and 400b. After a conductive layer of aluminum, copper, or alloys of these metals, a hard mask layer and others are formed, a resist pattern is formed thereon. These layers are etched into a predetermined pattern, thereby forming the bitline wiring layer (or bit line BL) 53, $V_{SS}$ wiring layer, and $V_{DD}$ wiring layer and second wiring layer 500 in the same step. An insulating layer formed of silicon oxide is formed thereon by the HDP method or the like, and a passivation layer formed of silicon nitride or the like is formed thereon.

As described above, according to the semiconductor device of the present invention, since the patterns of each layer can be simplified and easily subjected to microprocessing, a semiconductor device with a reduced size, for example, a semiconductor device having a 0.18 μm design rule SRAM with a memory cell size of 4.5 μm$^2$ or less can be fabricated. Moreover, the thickness of the drain-drain connecting layer can be reduced, whereby processing with higher accuracy can be ensured. This increases yield.

Note that this invention is not limited to the above embodiment, and various modifications can be made within the scope of the invention.

What is claimed is:

1. A semiconductor device comprising:
    a memory cell portion having memory cells each of which includes two load transistors, two driver transistors, and two access transistors; and
    a peripheral circuit portion which includes MOS transistors, wherein:
        each of the memory cells includes first and second gate-gate connecting layers, first and second drain-drain connecting layers, and first and second drain-gate connecting layers;
        the first and second gate-gate connecting layers are formed over a semiconductor substrate;
        the first and second drain-drain connecting layers are formed over a first interlayer dielectric and connect drains of the load transistors with drains of the driver transistors;
        the first and second drain-gate connecting layers are formed over a second interlayer dielectric;
        the first drain-gate connecting layer connects the first drain-drain connecting layer to the second gate-gate connecting layer;
        the second drain-gate connecting layer connects the second drain-drain connecting layer to the first gate-gate connecting layer;
        the first and second gate-gate connecting layers, the first and second drain-drain connecting layers, and the first and second drain-gate connecting layers are provided in different layers at different levels;
        the peripheral circuit portion has the first interlayer dielectric, the second interlayer dielectric, and a first wiring layer formed over the second interlayer dielectric; and
        the first and second drain-gate connecting layers and the first wiring layer are formed in a layer at the same level.

2. The semiconductor device as defined in claim 1,
    wherein each of the memory cells includes an upper wiring layer formed over a third interlayer dielectric;
    wherein the peripheral circuit portion includes the third interlayer and a second wiring layer formed over the third interlayer dielectric; and
    the upper wiring layer and the second wiring layer are formed in a layer at the same level.

3. The semiconductor device as defined in claim 2,
    wherein the upper wiring layer is a bitline wiring layer.

4. The semiconductor device as defined in claim 1,
    wherein each of the first and second drain-drain connecting layers has a thickness of 50 to 200 nm.

5. The semiconductor device as defined in claim 1,
    wherein each of the first and second drain-drain connecting layers has a sheet resistance of 50 Ω/□ or less.

6. The semiconductor device as defined in claim 1, further comprising:
    first contact portions formed in the first interlayer dielectric;
    second contact portions formed in the second interlayer dielectric; and
    third contact portions formed through the first interlayer dielectric and second interlayer dielectric.

7. The semiconductor device as defined in claim 6,
    wherein the first and second gate-gate connecting layers are connected to the first and second drain-drain connecting layers by the first contact portions.

8. The semiconductor device as defined in claim 6,
    wherein the first and second gate-gate connecting layers are connected to the first and second drain-gate connecting layers by the third contact portions.

9. The semiconductor device as defined in claim 6, further comprising:
    first contact pad layers which are formed in the step of forming the first and second drain-drain connecting layers and used to connect the upper wiring layer to source/drain regions of the access transistors;
    wherein the second contact portions are formed over the first contact portions with the first contact pad layers interposed.

10. The semiconductor device as defined in claim 6,
    wherein the second contact portions are formed over the first and second drain-drain connecting layers and connect the first and second drain-drain connecting layers to the first and second drain-gate connecting layers.

11. The semiconductor device as defined in claim 6,
    wherein contact holes of the third contact portions have an aspect ratio of 6 or less.

12. The semiconductor device as defined in claim 1,
    wherein each of the first and second drain-drain connecting layers includes a refractory metal nitride layer.

13. The semiconductor device as defined in claim 12,
    wherein each of the first and second drain-drain connecting layers further includes a refractory metal layer.

14. The semiconductor device as defined in claim 1,
    wherein an insulating layer containing silicon nitride and silicon oxide is formed over the semiconductor substrate.

15. The semiconductor device as defined in claim 1,
    wherein the distance between the semiconductor substrate and the first and second drain-drain connecting layers is 300 to 1000 nm.

16. The semiconductor device as defined in claim 1,
    wherein the distance between the first and second drain-drain connecting layers and the first and second drain-gate connecting layers is 200 to 600 nm.

17. The semiconductor device as defined in claim 1,
    wherein the distance between the semiconductor substrate and the first and second drain-gate connecting layers is 1400 nm or less.

18. The semiconductor device as defined in claim 1, further comprising other circuit regions.

19. The semiconductor device as defined in claim 18, wherein the other circuit regions includes a logic circuit.

20. A method of fabricating a semiconductor device in which a memory cell portion having memory cells each of which includes two load transistors, two driver transistors and two access transistors, and a peripheral circuit portion which includes MOS transistors are respectively formed in predetermined regions of a semiconductor substrate, the method comprising the steps of:

(a) forming a gate-gate connecting layer over the semiconductor substrate within a region of the memory cells and forming a gate electrode layer over the semiconductor substrate within a region of the peripheral circuit portion;

(b) forming a first interlayer dielectric over the semiconductor substrate within a region of the gate electrode layer and the gate-gate connecting layer;

(c) forming a drain-drain connecting layer over part of the first interlayer dielectric within a region of the memory cells;

(d) forming a second interlayer dielectric over the first interlayer dielectric; and (e) forming a drain-gate connecting layer over the second interlayer dielectric within a region of the memory cells and forming a first wiring layer over the second interlayer dielectric within a region of the peripheral circuit portion.

21. The method of fabricating a semiconductor device as defined in claim 20, further comprising the steps of:

(f) forming a third interlayer dielectric over the second interlayer dielectric; and (g) forming an upper wiring layer over the third interlayer dielectric within a region of the memory cells, and forming a second wiring layer over the third interlayer dielectric within a region of the peripheral circuit portion.

22. The method of fabricating a semiconductor device as defined in claim 20, wherein an insulating layer containing silicon nitride and silicon oxide is formed over the semiconductor substrate after the step (a).

23. The method of fabricating a semiconductor device as defined in claim 20, further comprising the steps of:

(h) forming first contact portions in the first interlayer dielectric;

(i) forming third contact portions through the first interlayer dielectric and the second interlayer dielectric; and (j) forming second contact portions in the second interlayer dielectric.

24. The method of fabricating a semiconductor device as defined in claim 23, wherein first contact pad layers which connect the first contact portions to the second contact portions are formed over the first interlayer dielectric together with the first and second drain-drain connecting layers in the step (c).

* * * * *